(12) United States Patent
Khan et al.

(10) Patent No.: US 11,846,741 B2
(45) Date of Patent: Dec. 19, 2023

(54) SYSTEMS AND METHODS FOR EVALUATING A SIMULATION MODEL OF A HYDROCARBON FIELD

(71) Applicant: Saudi Arabian Oil Company, Dhahran (SA)

(72) Inventors: Waqas Ahmed Khan, Khobar (SA); Nauman Aqeel, Dhahran (SA); Ali M. Al-Shahri, Doha (SA)

(73) Assignee: Saudi Arabian Oil Company, Dhahran (SA)

( * ) Notice: Subject to any disclaimer, the term of this patent is extended or adjusted under 35 U.S.C. 154(b) by 88 days.

(21) Appl. No.: 17/073,772

(22) Filed: Oct. 19, 2020

(65) Prior Publication Data

US 2021/0311217 A1 Oct. 7, 2021

Related U.S. Application Data

(60) Provisional application No. 63/005,647, filed on Apr. 6, 2020.

(51) Int. Cl.
*G01V 1/34* (2006.01)
*G06F 30/20* (2020.01)
(Continued)

(52) U.S. Cl.
CPC .............. *G01V 1/345* (2013.01); *G01V 1/003* (2013.01); *G01V 1/50* (2013.01); *G01V 99/005* (2013.01); *G06F 30/20* (2020.01)

(58) Field of Classification Search
CPC .......... G01V 1/345; G01V 1/003; G01V 1/50; G01V 99/005; G06F 30/20; E21B 49/00; E21B 43/00; E21B 41/00
See application file for complete search history.

(56) References Cited

U.S. PATENT DOCUMENTS 6,826,483 B1 11/2004 Anderson et al.
8,285,532 B2 10/2012 Zangl et al.
(Continued)

OTHER PUBLICATIONS

International Search Report and Written Opinion dated Feb. 26, 2021 pertaining to International application No. PCT/US2020/061244 filed Nov. 19, 2020, 13 pgs.
(Continued)

*Primary Examiner* — Catherine T. Rastovski
*Assistant Examiner* — Yossef Korang-Beheshti
(74) *Attorney, Agent, or Firm* — DINSMORE & SHOHL, LLP

(57) ABSTRACT

Systems and methods for evaluating simulation models are disclosed. In one embodiment, a method of evaluating a simulation model of a hydrocarbon field includes merging simulated reservoir data and actual reservoir data to generate merged reservoir data, and cross-linking the merged reservoir data with three-dimensional model data. The method further includes calculating one or more surface metrics from at least one of the merged reservoir data and the three-dimensional model data, calculating one or more subsurface metrics from at least one of the merged reservoir data and the three-dimensional model data, and calculating one or more overall history match indicators, one or more surface history match indicators, and one or more subsurface history match indicators from the one or more surface metrics, the one or more subsurface metrics, and the three-dimensional model data.

14 Claims, 9 Drawing Sheets

(51) Int. Cl.
*G01V 1/50* (2006.01)
*G01V 1/00* (2006.01)
*G01V 99/00* (2009.01)

(56) References Cited

U.S. PATENT DOCUMENTS

| | | | |
|---|---|---|---|
| 8,762,118 B2 * | 6/2014 | Nasreldin | G01V 99/005 |
| | | | 703/10 |
| 8,892,388 B2 | 11/2014 | Courtade et al. | |
| 9,703,006 B2 | 7/2017 | Stern et al. | |
| 9,779,060 B2 | 10/2017 | Maucec | |
| 10,627,542 B2 | 4/2020 | Singh et al. | |
| 2007/0016389 A1 * | 1/2007 | Ozgen | E21B 49/00 |
| | | | 703/10 |
| 2010/0076740 A1 * | 3/2010 | Kuchuk | E21B 49/087 |
| | | | 703/10 |
| 2010/0206559 A1 * | 8/2010 | Sequeira, Jr. | E21B 41/00 |
| | | | 166/250.15 |
| 2010/0299629 A1 * | 11/2010 | Faist | G06F 3/0485 |
| | | | 715/801 |
| 2013/0035919 A1 * | 2/2013 | Al-Shammari | G06F 30/20 |
| | | | 703/10 |
| 2013/0096703 A1 * | 4/2013 | Kurtenbach | G06F 3/0484 |
| | | | 703/6 |
| 2014/0039859 A1 * | 2/2014 | Maucec | E21B 43/00 |
| | | | 703/10 |
| 2014/0330547 A1 | 11/2014 | Calvert et al. | |
| 2016/0273315 A1 * | 9/2016 | Carvajal | E21B 41/0092 |
| 2017/0337302 A1 | 11/2017 | Mezghani et al. | |
| 2018/0032356 A1 | 2/2018 | Su et al. | |
| 2018/0188403 A1 * | 7/2018 | Halsey | G01V 1/50 |

OTHER PUBLICATIONS

Bhark et al., "Assisted History Matching Benchmarking: Design of Experiments-based Techniques", Society of Petroleum Engineers, SPE 170690, 2014.

Rwechungura et al., Society of Petroleum Engineers, SPE 142497, 2011.

* cited by examiner

SYSTEMS AND METHODS FOR EVALUATING A SIMULATION MODEL OF A HYDROCARBON FIELD

CROSS-REFERENCE TO RELATED APPLICATIONS

This application claims the benefit of priority under 35 U.S.C. § 119 to U.S. Provisional Application No. 63/005,647, filed on Apr. 6, 2020 and entitled "SYSTEM AND WORKFLOW TO COMPARE, ANALYZE AND BENCHMARK MULTIPLE RESERVOIR SIMULATION HISTORY MATCH CASES FOR DIFFERENT FIELDS AT SURFACE AND SUB-SURFACE (RESERVOIR) LEVEL," the contents of which are hereby incorporated by reference in its entirety.

BACKGROUND

Oil and gas companies may annually update a business plan that is used for budgeting forecasts and resources allocation. This process may involve identifying areas of development where future wells will be drilled. Simulation models of oil and/or gas fields may be used to calculate various parameters of the field(s) to predict hydrocarbon production. The results of the simulations may then be used to deploy resources to most efficiently extract hydrocarbons from the field(s).

The simulation model that is used to make the predictions should accurately reflect the realities of the hydrocarbon field(s). A history matching process may be used to compare simulated reservoir data generated by a simulation model to actual reservoir data. Simulation models may be modified so that the models more accurately reflect reality. Conventionally, history match quality is quantified by only using surface production, injection and pressure data. However, these approaches do not take into account subsurface (i.e., reservoir level) history match. Further, conventional approaches do not quantify the magnitude and subjectivity of changes that are made to the simulation models to obtain better history match quality. Unrealistic changes to the simulation model may lead to inaccurate predictions.

SUMMARY

Embodiments of the present disclosure are directed to systems and methods for evaluating simulation models that simulate hydrocarbon fields. Embodiments employ history matching that includes surface history match indicators, subsurface history match indicators, and change history match indicators. The change history match indicators quantify the magnitude and subjectivity of changes made to an original simulation model to increase history match quality. Graphical user interfaces are provided to enable a user to evaluate simulation models at a glance.

In one embodiment, a method of evaluating a simulation model of a hydrocarbon field includes retrieving, from one or more databases, simulated reservoir data and actual reservoir data for the hydrocarbon field, retrieving, from the one or more databases, three-dimensional model data of at least one selected simulation model of the hydrocarbon field, merging the simulated reservoir data and the actual reservoir data to generate merged reservoir data, and cross-linking the merged reservoir data with the three-dimensional model data. The method further includes calculating one or more surface metrics from at least one of the merged reservoir data and the three-dimensional model data, calculating one or more subsurface metrics from at least one of the merged reservoir data and the three-dimensional model data, and calculating one or more overall history match indicators, one or more surface history match indicators, and one or more subsurface history match indicators from the one or more surface metrics, the one or more subsurface metrics, and the three-dimensional model data. The method also includes displaying, in a graphical user interface on an electronic display, the one or more overall history match indicators, the one or more surface history match indicators, and the one or more subsurface history match indicators.

In another embodiment, a system for evaluating a simulation model of a hydrocarbon field includes one or more processors, an electronic display, and a non-transitory computer-readable memory storing instructions. When executed by the one or more processors, the instructions cause the one or more processors to retrieve, from one or more databases, simulated reservoir data and actual reservoir data for the hydrocarbon field, retrieve, from the one or more databases, three-dimensional model data of at least one selected simulation model of the hydrocarbon field, merge the simulated reservoir data and the actual reservoir data to generate merged reservoir data, and cross-link the merged reservoir data with the three-dimensional model data. The instructions further cause the one or more processors to calculate one or more surface metrics from at least one of the merged reservoir data and the three-dimensional model data, calculate one or more subsurface metrics from at least one of the merged reservoir data and the three-dimensional model data, and calculate one or more overall history match indicators, one or more surface history match indicators, and one or more subsurface history match indicators from the one or more surface metrics, the one or more subsurface metrics, and the three-dimensional model data. The instructions also cause the one or more processors to display, in a graphical user interface on the electronic display, the one or more overall history match indicators, the one or more surface history match indicators, and the one or more subsurface history match indicators.

It is to be understood that both the foregoing general description and the following detailed description present embodiments that are intended to provide an overview or framework for understanding the nature and character of the claims. The accompanying drawings are included to provide a further understanding of the disclosure, and are incorporated into and constitute a part of this specification. The drawings illustrate various embodiments and together with the description serve to explain the principles and operation.

DETAILED DESCRIPTION OF THE DISCLOSURE

Embodiments of the present disclosure are directed to systems and methods for evaluating simulation models that simulate hydrocarbon fields. More particularly, embodiments calculate metrics used for history matching that compare simulated reservoir data with actual reservoir data. From the metrics, history match indicators based on user-defined criterion are calculated and displayed. Both surface and subsurface history match indicators are calculated and displayed. Further, the history match indicators include a permeability change history match indicator and a local change indicator that provides insight as to how changes were made to the original simulation model. Users may drill-down within a graphical user interface to map individual wells, and plot attribute profiles of individual wells. A graphical user interface may also be used to compare multiple simulation models with respect to how they were modified from the original models.

Figure 1:
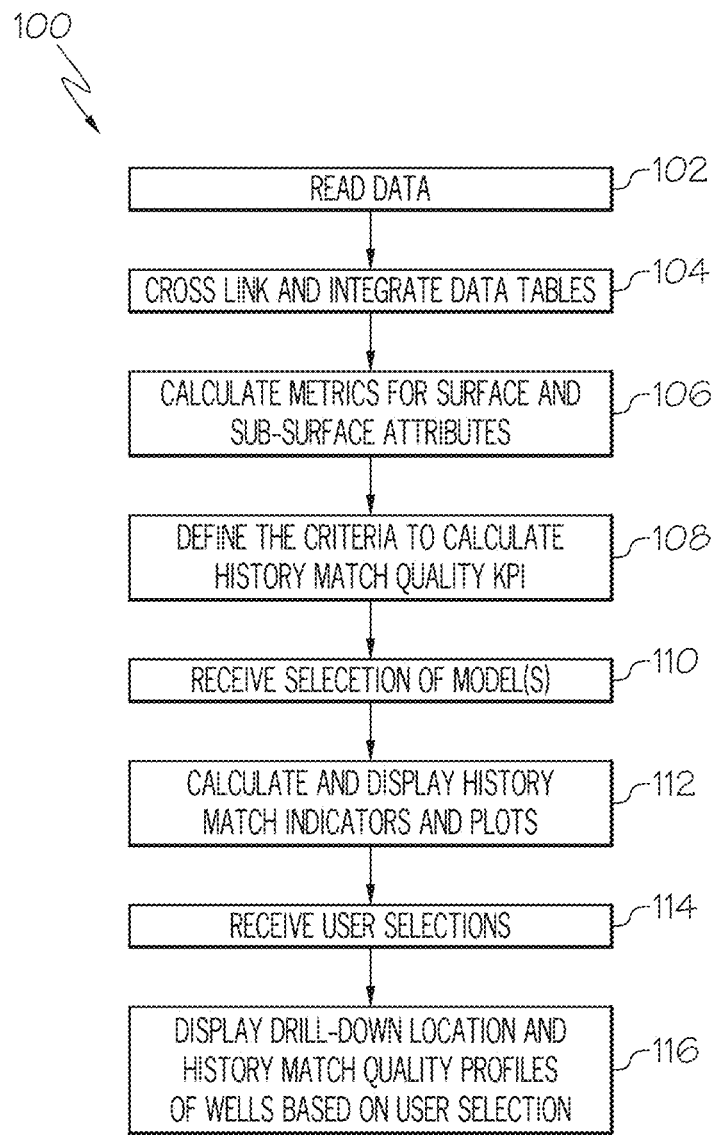
FIG. 1 illustrates an example method of evaluating a simulation model of a hydrocarbon field according to one or more embodiments described and illustrated herein.

Referring now to FIG. 1, a non-limiting example method of evaluating a simulation model of a hydrocarbon field is illustrated by flowchart 100. It should be understood that embodiments are not limited by the number or arrangement of steps shown by FIG. 1. At block 102, data are read from one or more databases. The data include, but are not limited to simulated reservoir data, actual reservoir data, and three-dimensional model data for one or more hydrocarbon fields. The simulated reservoir data includes simulation results generated by one or more simulators of attributes of reservoir(s) of a hydrocarbon field. The simulation results may be used to make field development decisions, for example.

Figure 2:
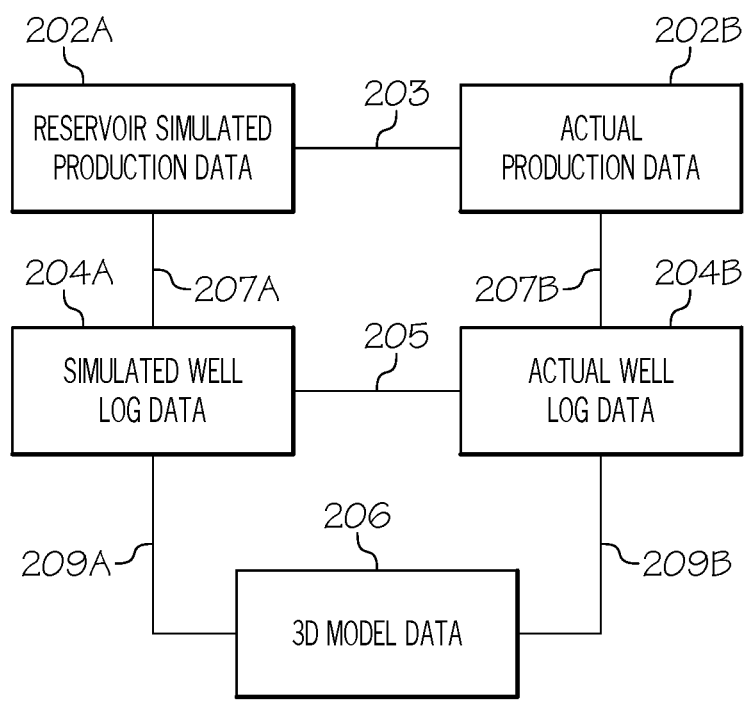
FIG. 2 illustrates any example method of merging simulated reservoir data and actual reservoir data, and cross-linking the merged data and three-dimensional model data according to one or more embodiments described and illustrated herein.

Referring to FIG. 2, the simulated reservoir data include, but are not limited to, simulated production data 202A and simulated well log data 204A. The simulated reservoir data may correspond to all wells of a field (or multiple fields) or a sub-set of all of the wells. Non-limiting example simulated production data 202A include:

Simulation Model Name
Well Name and Number
Unique Well Identifier (UWI)
Date
Simulation Oil Rate
Simulation Water Rate
Simulation Gas Rate
Simulation Water Cut
Simulation Gas Oil Ratio
Simulation Gas Injection Rate
Simulation Water Injection Rate
Simulation Static Bottom Hole Pressure.

The simulation model name corresponds to the name of the particular simulation. As described in more detail below, multiple simulation models may be run and compared using history matching to identify the most accurate simulation model. The simulation model name provides an identifier for the individual simulation models that were run. The well name, number and unique well identifier are used to identify the individual wells within the field(s). The well number is a number (1, 2, 3 . . . and so on) designated to each well. Well Name may be a lettered field name abbreviation followed by the well number, for example such as ABCD-1, ABCD-2, ABCD-3 and so on. Unique well identifier is a unique number for each well name. Whereas a well number will repeat for a different field, the well name and the unique well identifier are always unique for all wells even across multiple fields. For identifying and comparing wells between simulation and actual production data, only a unique well identifier may be needed. The date field provides the date of the simulated data. The remainder of the simulated production data corresponds to various well attributes.

The simulated well log data 204A corresponds to all wells of a field (or multiple fields) or a sub-set of all of the wells, at multiple depths. Simulated well log data include, but are not limited to:

Field Name
Reservoir Name
Well Name and Number
Unique Well Identifier (UWI)
Measured Depth
Simulation Saturation
Simulation Porosity
Simulation Permeability The well log attributes of simulation saturation, simulation porosity, and simulation permeability are all evaluated at various measured depths.

In some embodiments, the simulated production data and the simulated well log data are stored in one or more tables.

Still referring to FIG. 2, the actual reservoir data include, but are not limited to, actual production data 202B and actual well log data 204B. The actual reservoir data are generated from actual hydrocarbon production from all wells (or some sub-set of wells) of one or more fields. As described in more detail below, the actual reservoir data and the simulated reservoir data are compared by a history matching process to quantify the accuracy of one or more simulation models.

Non-limiting example actual production data include:

Field Name
Reservoir Name
Well Name and Number
Unique Well Identifier (UWI)
Date
Actual Oil Rate
Actual Water Rate
Actual Gas Rate
Actual Water Cut
Actual Gas Oil Ratio
Actual Gas Injection Rate
Actual Water Injection Rate
Actual Static Bottom Hole Pressure The production data and the three-dimensional model data may be stored in the same database, or in separate databases. Embodiments are not limited by the type of production data and the three-dimensional model data.

The actual well log data correspond to all wells of a field (or multiple fields) or a sub-set of the wells, at multiple depths. Actual well log data are taken from the historical production of the wells. Actual well log data include, but are not limited to:

Field Name
Reservoir Name
Well Name and Number
Unique Well Identifier (UWI)

Measured Depth
Actual Saturation
Actual Porosity
Actual Permeability

The actual production data and the actual well log data may be stored in one or more tables. In addition to the simulated reservoir data and the actual reservoir data, basic well data may also be read from one or more databases and may include, but are not limited to:

Unique Well Identifier (UWI)
UTMX coordinate
UTMY coordinate
Well Geometry

Thus, the basic well data includes geographic location coordinates corresponding to the locations of the wells under evaluation. Additionally, well geometry providing information regarding the shape of the well may be included Well geometry identifies whether the well was drilled as vertical, deviated or horizontal.

Further, three-dimensional model data including three-dimensional properties from a three-dimensional gridded model are read. The three-dimensional model data may include, but are not limited to:

Original Porosity
Original Permeability (in X, Y and Z direction)
Simulation Porosity
Simulation Permeability (in X, Y and Z direction)
Reservoir Zones
Unique Well Identifier (UWI) property Referring back to FIG. 1, after the data are read, the workflow then relates all the tables of the various types of data provided above together in block 104 to derive insights and apply standard practices and workflows. Referring again to FIG. 2, this is done by merging, through the unique well identifier, the following:

simulated production data and actual production data to form merged production data; and
simulated well log data and actual well log data to form merged well log data.

As an example and not a limitation, the merged production data may be provided in a single merged production data table, and the merged well log data may be provided in a single merged well log data table. The merging of the data is done based on the unique well identifiers and the date. Line 203 represents the merging of the simulated production data 202A and the actual production data 202B into the single merged production data table based on unique well identifier and date. Line 205 represents the merging of the simulated well log data 204A and the actual well log data 204B into the single merged well log data table based on unique well identifier and date.

The simulated production data 202A and the simulated well log data 204A are not merged but rather cross-linked based on the unique well identifier as represented by line 207A. Similarly, the actual production data 202B and the actual well log data 204B are cross-linked based on the unique well identifier as represented by line 207B. The simulated well log data 204A and the actual well log data 204B are cross-linked with the three-dimensional model data 206 as shown by lines 209A and 209B, respectively.

Referring to block 106 of FIG. 1, with the merged and cross-linked data, embodiments are able to directly relate the simulated production data with actual production data, and relate the simulated well log data with actual well log data to calculate the metrics for surface history match quality and subsurface history match quality which are used together to calculate the overall history match quality.

Embodiments are not limited to the surface level and subsurface level metrics used to quantify surface and subsurface history match qualities. Non-limiting example metrics using the merged and cross-linked data are provided by table 1 below.

TABLE 1

| Attribute | Metric Calculation | Formula Description |
|---|---|---|
| Field Oil Production (Surface Level) | $FOP \text{ Metric} = 100 \times \dfrac{\sum \lvert \text{Actual } FOP - \text{Simulation } FOP \rvert}{\sum (\text{Actual } FOP + \text{Simulation } FOP)}$<br><br>Where FOP is a time series of Total Field Oil Production for each simulation case, calculated as sum of all the well level oil production for each time | Numerator: Sum of Absolute Errors in FOP<br>Denominator: Sum of Actual and Simulation FOP to normalize the error for comparison between different cases<br>Result: Result of this calculation yields a dimensionless percentage error between 0-100 of field level oil production match (1 value per simulation case) |
| Field Water Production (Surface Level) | $FWP \text{ Metric} = 100 \times \dfrac{\sum \lvert \text{Actual } FWP - \text{Simulation } FWP \rvert}{\sum (\text{Actual } FWP + \text{Simulation } FWP)}$<br><br>Where FWP is a time series of Total Field Water Production for each simulation case, calculated as sum of all the well level water production for each time | Numerator: Sum of Absolute Errors in FWP<br>Denominator: Sum of Actual and Simulation FWP to normalize the error for comparison between different cases<br>Result: Result of this calculation yields a dimensionless percentage error between 0-100 of field level water production match (1 value per simulation case) |

TABLE 1-continued

| Attribute | Metric Calculation | Formula Description |
|---|---|---|
| Well Static Bottomhole Pressure (Surface Level) | SBHP Metric = Avg(\|Actual SBHP − Simulation SBHP\|) Where SBHP is a time series of Static Bottom Hole Pressure for each well in each simulation case | Numerator: Mean absolute error in pressure Result: Result of this calculation yields an average error in pressure per well with units of pressure (1 value per well per simulation case) |
| Well Water Production (Surface Level) | $WWP \text{ Metric} = 100 \times \frac{\sum \|\text{Actual } WWP - \text{Simulation } WWP\|}{\sum (\text{Actual } WWP + \text{Simulation } WWP)}$ Where WWP is a time series of Well Water Production for each well in each simulation case | Numerator: Sum of Absolute Errors in WWP Denominator: Sum of Actual and Simulation WWP to normalize the error for comparison between different wells and cases Result: Result of this calculation yields a dimensionless percentage error between 0-100 of well level water production match (1 value per well per simulation case) |
| Well Gas Production (Surface Level) | $WGP \text{ Metric } 100 \times \frac{\sum \|\text{Actual } WGP - \text{Simulation } WGP\|}{\sum (\text{Actual } WGP + \text{Simulation } WGP)}$ Where WGP is a time series of Well Gas Production for each well in each simulation case | Numerator: Sum of Absolute Errors in WGP Denominator: Sum of Actual and Simulation WGP to normalize the error for comparison between different wells and cases Result: Result of this calculation yields a dimensionless percentage error between 0-100 of well level gas production match (1 value per well per simulation case) |
| Well Saturation Log Match (Sub-Surface Level) | SW Metric = Avg(\|Actual SW − Simulation SW\|) Where SW is the log water saturation for each well in each simulation case | Numerator: Mean absolute error in water saturation log Result: Result of this calculation yields an average error in water saturation per well (1 value per well per simulation case) |
| Permeability Changes Made as Fraction of Total Number of Cells (Sub-Surface Level) | $K \text{ Metric} = \frac{\text{Number of Model Cells Changed for } K}{\text{Total Number of Model Cells}}$ Where K is Permeability | Numerator: Number of cells which had to be modified for permeability value to achieve the history match Denominator: Total number of cells in the 3D model Result: Fraction between 0-1 to signify the extent of changes made (0 means no changes at all and 1 means all cells had to change) |
| Number of Local/Subjective Changes Made (Sub-Surface Level) | $LC \text{ Metric} = \frac{\text{Number of Cells with Local Changes}}{\text{Total Number of Model Cells}}$ Total Number of Model Cells Where LC is Local Change | The cell changes were categorized as local/subjective when the changes to model permeability resulted in creating artifacts (such as local patches around well, or cells/blocks with extremely high permeability surrounded by very low permeability) |

TABLE 1-continued

| Attribute | Metric Calculation | Formula Description |
| --- | --- | --- |
| | | in the model with no physical meaning. Counting the number of these cells and dividing by Total Number of model cells gives a metric of local/subjective changes. |

As shown by Table 1, the metrics quantify the difference between the simulated reservoir data and the actual reservoir data of a plurality of attributes by a history matching technique. Surface and subsurface metrics are calculated for each well. Column one of Table 1 provides the name of the metric, column two provides the formula for the respective metric, and column three provides a description of the respective metric and how it is calculated. For example, the FOP metric takes the sum of the absolute value of the difference between the simulated total field oil production and the actual total field oil production divided for a plurality of time periods divided by the sum of the simulated total field oil production and the actual total field oil production multiplied by 100. This surface metric illustrates the history match of the total field oil production for the simulated case versus the actual case.

Unlike conventional history matching workflows, embodiments of the present disclosure produce history matching metrics based on subsurface attributes, including, but not limited to, the well saturation log match ("SW") metric, the permeability ("K") metric and the local change ("LC") metric. The K metric and the LC metric provide insight as to how a simulation model has changed from the original simulation model. Engineers often make changes to a simulation model to make the simulation model more closely align with actual data. One common change is the permeability to the cells of the three-dimensional model so that the output of the three-dimensional model matches the actual permeability that was measured.

The K metric illustrates how significantly the permeability of the cells of the three-dimensional model were changed from the original three-dimensional model. As shown by Table 1, the K metric is calculated by dividing the number of cells changed for permeability by the total number of cells in the three-dimensional model.

A K metric of 0 would mean that the three-dimensional model is perfect and history match is achieved without changing even a single cell in the model. It is noted that this is unrealistic given the uncertainties when interpolating data between wells. On the other hand, a K metric of 1 would mean that all of cells in the three-dimensional model were changed in order to achieve history match, which would suggest that nowhere in the model (including at the wells) has the original geology preserved and is the other extreme. Ideally, a three-dimensional model having a good history match would be one which has an accurate geological model to begin with and hence requires very little changes to the number of cells, i.e. K metric values close to 0.

The LC metric builds on top of K metric and further provides a metric which identifies the nature and subjectivity of the changes made. More particularly, the LC metric provides insight as to whether the changes to permeability were made globally to the three-dimensional model or if the changes were more local in nature. In some cases, an engineer may make global permeability changes across all of the cells or a significant number of cells across the three-dimensional model to achieve better history matching. Global changes made across a certain layer or reservoir could be explained by physics and underlying geology; however local changes made just around the cells, in rectangular, circular or any other shape are changes which cannot be explained. Sometime these local changes are made because this remains the only way to achieve the history match in a certain area without affecting the rest of the model.

However, such local changes can create artifacts in the model, such as local patches around a well, or cells or blocks of cells that have extremely high permeability values surrounded by cells or blocks of cells with very low permeability. These artifacts are likely to not naturally occur and thus make the three-dimensional model an inaccurate representation of the field(s). A three-dimensional model should be geologically consistent if the three-dimensional model is to be used for predictions.

Highlighting the local changes as calculated provide provides a means of quantifying whether the three-dimensional model can be used for prediction. A new well drilled in an area with local changes would result in poor prediction results as compared to the well where there are no local changes.

As shown by Table 1, the LC metric is calculated by dividing the total number of cells in the three-dimensional model that were labeled as locally changed by the total number of cells. Cells may be labeled as locally changed by any number of ways. In one non-limiting example, cells that were not changed are filtered out by calculating, for each cell, a ratio of the modified property (e.g., permeability) and the original property, and removing all cells where the ratio is not equal to 1. Cells that have a ratio other than 1 are binned together based on the magnitude of the changes such that cells having a similar magnitude of change are binned together. Next, within each bin of cells, regions of connected cells are identified. Connected cells are those that are adjacent to one another. Then, a three-dimensional boundary polygon is formed around each region, and the process counts how many of the regions are bound by straight lines and/or regularly shaped curves (which gives an indication of regular shapes, such as cubes, cuboids, spheres, etc.). Cells within such regions defined by straight lines and/or regularly shaped curves are identified as locally changed.

Ideally, the value of LC should be 0 and not a single cell should be modified locally (unless physical reason exists, in which case it should have been fixed in geological model before running a simulation). A high value of the LC metric glance highlights poor history match methodology (even if surface data is matching point to point).

Referring once again to FIG. 1, at block 108, criterion for calculating history match indicators (e.g., key performance indicators) are received. Any number of history match indicators may be generated based on any criteria. For example, a history match indicator may be calculated for each metric, such as the example metrics listed above in Table 1. Table 2 below illustrates a plurality of non-limiting example history match indicators. In the illustrated examples, an indicator of 5 is considered the best and an indicator of 0 is considered the worst.

TABLE 2

| Attribute | Criteria for KPI Calculation | Formula Description |
|---|---|---|
| Field Oil Production (Surface Level) | If FOP Metric > v5 then FOP KPI 0<br>If FOP Metric Between v4 & v5 then FOP KPI 1<br>If FOP Metric Between v3 & v4 then FOP KPI 2<br>If FOP Metric Between v2 & v3 then FOP KPI 3<br>If FOP Metric Between v1 & v2 then FOP KPI 4<br>If FOP Metric < v1 then FOP KPI 5 | KPI values best (5) to worst (0) v1 to v5 are the percentage error threshold values set between 0-100 (as explained in step 3) based on user input, it stays fixed for all the cases |
| Field Water Production (Surface Level) | If FWP Metric > v5 then FWP KPI 0<br>If FWP Metric Between v4 & v5 then FWP KPI 1<br>If FWP Metric Between v3 & v4 then FWP KPI 2<br>If FWP Metric Between v2 & v3 then FWP KPI 3<br>If FWP Metric Between v1 & v2 then FWP KPI 4<br>If FWP Metric < v1 then FWP KPI 5 | KPI values best (5) to worst (0) v1 to v5 are the percentage error threshold values set between 0-100 (as explained in step 3) based on user input, it stays fixed for all the cases |
| Well Static Bottomhole Pressure (Surface Level) | If SBHP Metric > v5 then SBHP KPI 0<br>If SBHP Metric Between v4 & v5 then SBHP KPI 1<br>If SBHP Metric Between v3 & v4 then SBHP KPI 2<br>If SBHP Metric Between v2 & v3 then SBHP KPI 3<br>If SBHP Metric Between v1 & v2 then SBHP KPI 4<br>If SBHP Metric < v1 then SBHP KPI 5 | KPI values best (5) to worst (0) v1 to v5 are the pressure threshold values in psi (as explained in step 3) based on user input, it stays fixed for all the cases |
| Well Water Production (Surface Level) | If WWP Metric > v5 then WWP KPI 0<br>If WWP Metric Between v4 & v5 then WWP KPI 1<br>If WWP Metric Between v3 & v4 then WWP KPI 2<br>If WWP Metric Between v2 & v3 then WWP KPI 3<br>If WWP Metric Between v1 & v2 then WWP KPI 4<br>If WWP Metric < v1 then WWP KPI 5 | KPI values best (5) to worst (0) v1 to v5 are the percentage error threshold values set between 0-100 (as explained in step 3) based on user input, it stays fixed for all the cases |
| Well Gas Production (Surface Level) | If WGP Metric > v5 then WGP KPI 0<br>If WGP Metric Between v4 & v5 then WGP KPI 1<br>If WGP Metric Between v3 & v4 then WGP KPI 2<br>If WGP Metric Between v2 & v3 then WGP KPI 3<br>If WGP Metric Between v1 & v2 then WGP KPI 4<br>If WGP Metric < v1 then WGP KPI 5 | KPI values best (5) to worst (0) v1 to v5 are the percentage error threshold values set between 0-100 (as explained in step 3) based on user input, it stays fixed for all the cases |
| Well Saturation Log Match (Sub-Surface Level) | If SW Metric > v5 then SW KPI 0<br>If SW Metric Between v4 & v5 then SW KPI 1<br>If SW Metric Between v3 & v4 then SW KPI 2<br>If SW Metric Between v2 & v3 then SW KPI 3<br>If SW Metric Between v1 & v2 then SW KPI 4<br>If SW Metric < v1 then SW KPI 5 | KPI values best (5) to worst (0) v1 to v5 are the saturation unit threshold values (as explained in step 3) based on user input, it stays fixed for all the cases |
| Permeability Changes Made as Fraction of Total Number of Cells (Sub-Surface Level) | If K Metric > v5 then K KPI 0<br>If K Metric Between v4 & v5 then K KPI 1<br>If K Metric Between v3 & v4 then K KPI 2<br>If K Metric Between v2 & v3 then K KPI 3<br>If K Metric Between v1 & v2 then K KPI 4<br>If K Metric < v1 then K KPI 5 | KPI values best (5) to worst (0) v1 to v5 are the fraction values between 0-1 to signify the magnitude of changes made (as explained in step 3) based on user input, it stays fixed for all the cases |

TABLE 2-continued

| Attribute | Criteria for KPI Calculation | Formula Description |
|---|---|---|
| Number of Local/ Subjective Changes Made (Sub-Surface Level) | If LC Metric > v5 then LC KPI 0<br>If LC Metric Between v4 & v5 then LC KPI 1<br>If LC Metric Between v3 & v4 then LC KPI 2<br>If LC Metric Between v2 & v3 then LC KPI 3<br>If LC Metric Between v1 & v2 then LC KPI 4<br>If LC Metric Between v1 & v2 then LC KPI 4<br>If LC Metric < v1 then LC KPI 5 | KPI values best (5) to worst (0) v1 to v5 are the fraction values between 0-1 to signify the subjectivity of changes made (as explained in step 3) based on user input, it stays fixed for all the cases |

Figure 3A:
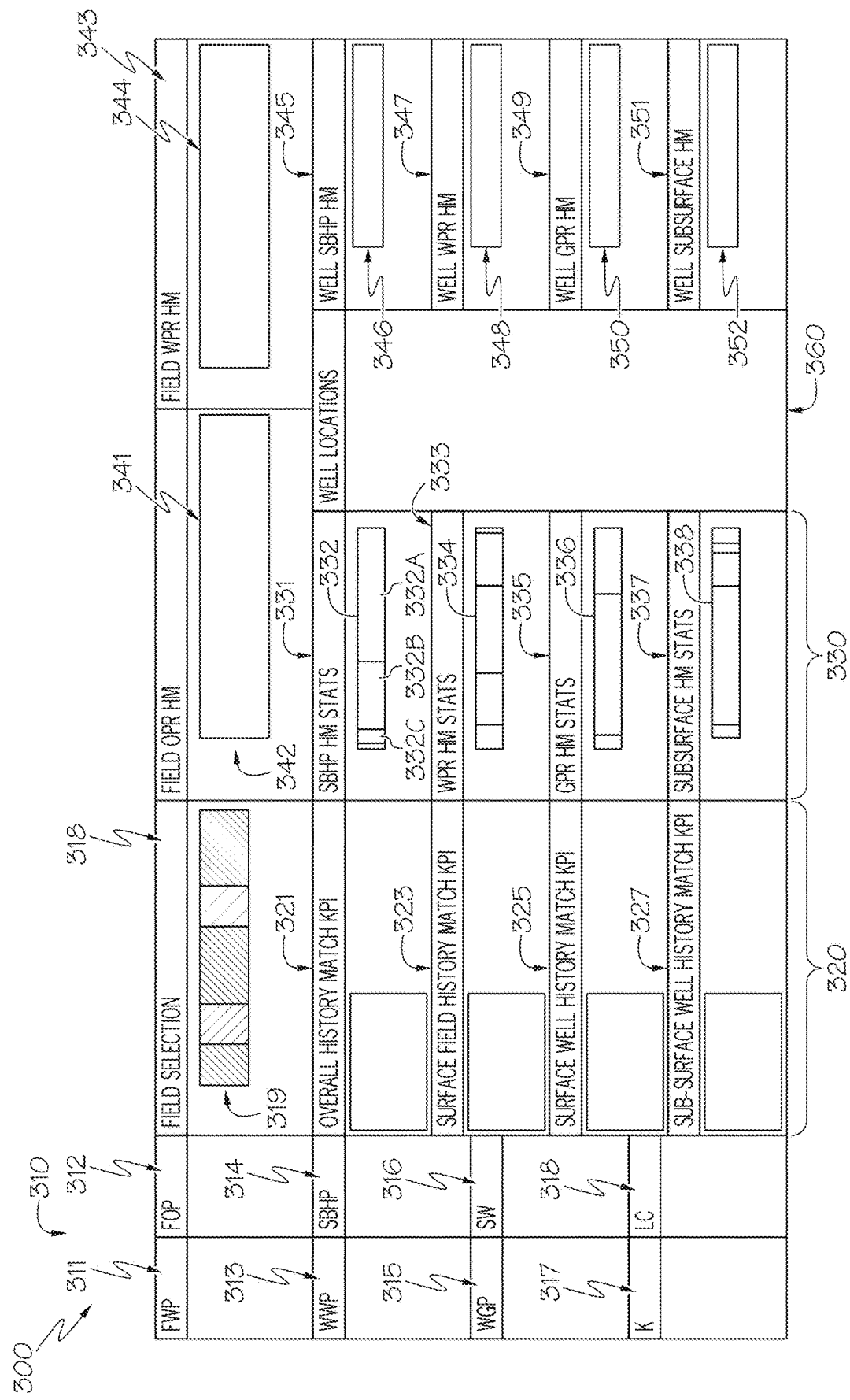
FIG. 3A illustrates an example graphical user interface for displaying history match indicators according to one or more embodiments described and illustrated herein.

Referring now to FIG. 3A, an example graphical user interface 300 for evaluating a simulation model of a hydrocarbon field is illustrated. It should be understood that embodiments may take on different configurations and layouts than the example graphical user interface 300 shown in FIG. 3A. FIG. 3A illustrates a general overview of the example graphical user interface 300. Additional details within the various windows of the example graphical user interface are provided in FIGS. 3A and 3C. The graphical user interface 300 includes a plurality of windows that provide the ability for a user to make input selections as well as view data, such as history match indicators, metrics, and the like.

Figure 3B:
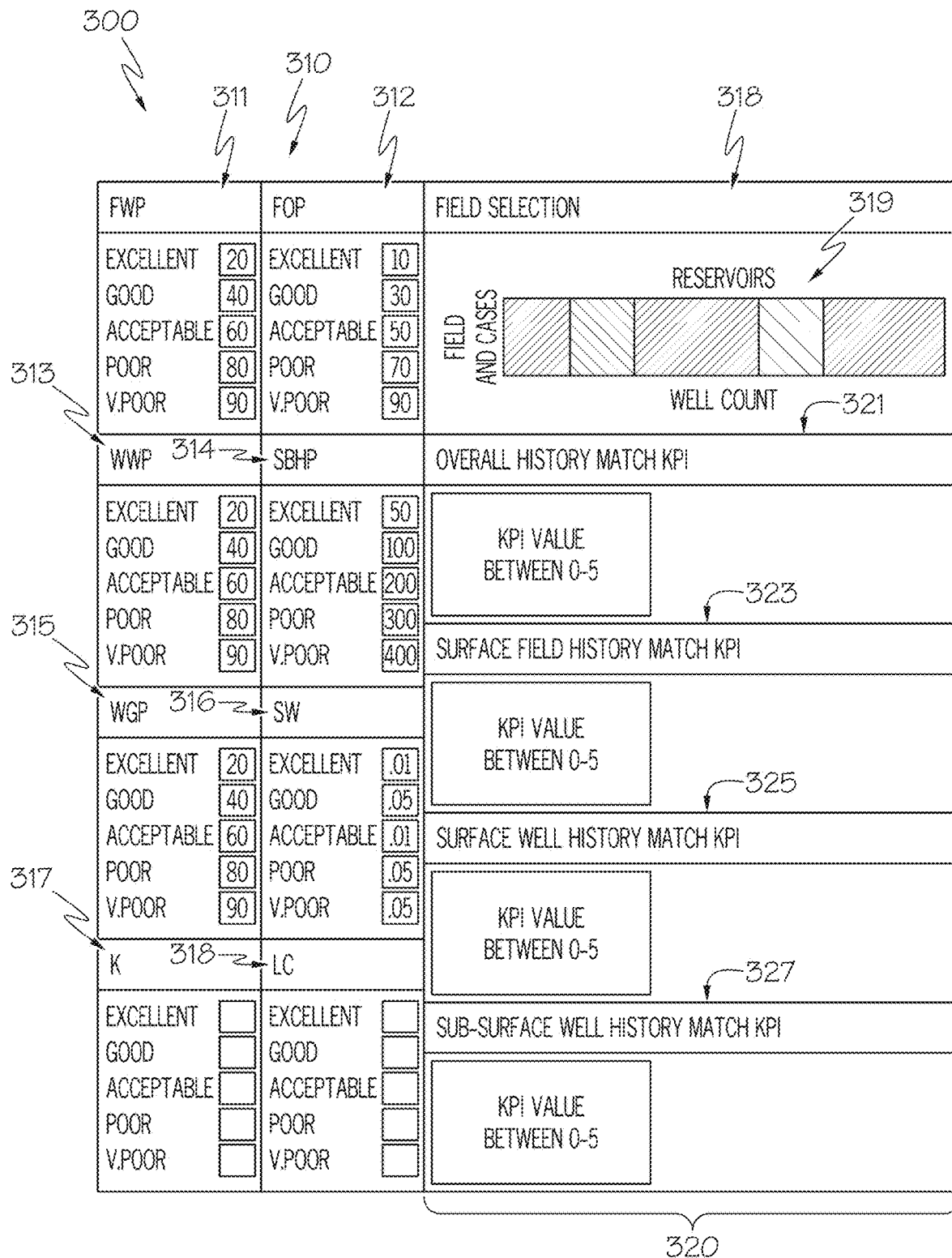
FIG. 3B illustrates a close-up view of the graphical user interface illustrated by FIG. 3A.

As described above, the criterion for the history match indicators for the metrics are customizable and may be set by the user. A criterion section 310 of the graphical user interface 300 includes windows 311-318 that include fields for the user to enter values that define the ranges for the history match indicators. FIG. 3B provides a close-up view of the criterion section 310 of FIG. 3A. In the illustrated embodiment, each window 311-318 includes an "Excellent" field, a "Good" field, an "Acceptable" field, a "Poor" field, and a "V. Poor" (i.e., very poor) field. The user may enter values to set the thresholds accordingly. For the field water production (FWP) history match indicator of window 311, the user has set "V. Poor" to FWP metric values greater than or equal to 90, "Poor" to FWP metric values between 80 and 89, "Acceptable" to FWP metric values between 60 and 79, "Good" to FWP metric values between 50 and 59, and "Excellent" to FWP metric values greater than or equal to 30.

Window 318 includes a plurality of fields that a user may select. In the illustrated example, a graph 319 configured as a bar is provided having several segments, with each segment corresponding to a particular field. The size of the segments corresponds with the number of wells in the field. The larger the segment, the greater the number of wells in the represented field. The user may select a desired field by clicking or otherwise selecting a segment of the graph 319. It should be understood that window 318 may represent the fields in manners other than that shown in FIG. 3A. Selection of a field causes the system to calculate the various metrics for each well in the field.

Referring once again to FIG. 1, the user selects one or more models for evaluation at block 110. The selection of the one or more models may be done in the graphical user interface 300, for example. As a non-limiting example, one or more screens of the graphical user interface may include a drop-down menu or other graphical element by which a user may select a model. After selection of a field, one or more models, and establishing the criterion for the field match metrics, at block 112 the system calculates and displays various history match indicators (e.g., overall history match indicators, surface history match indicators, and subsurface history match indicators) and calculates and displays various plots.

Figure 3C:
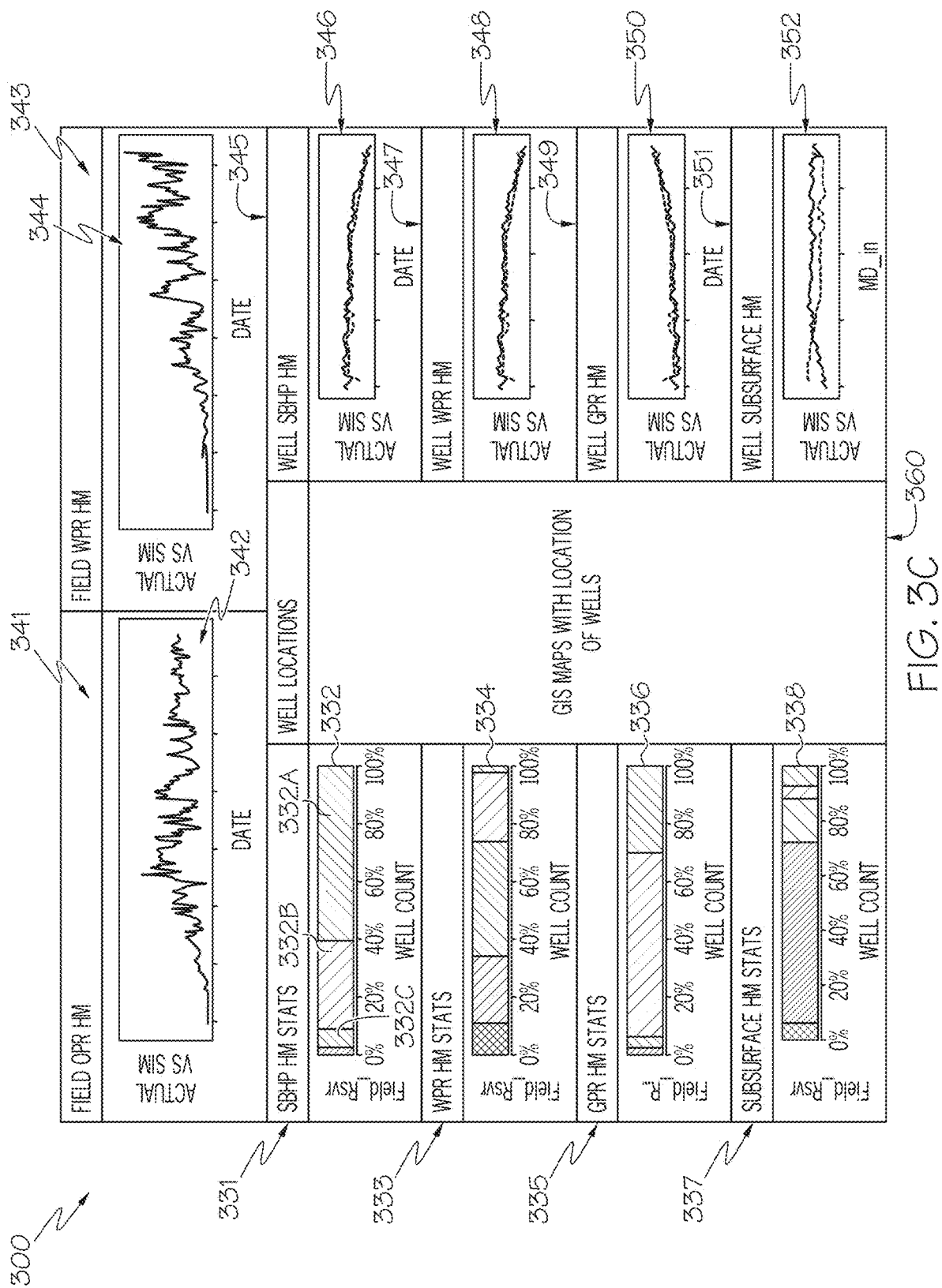
FIG. 3C illustrates another close-up view of the graphical user interface illustrated by FIG. 3A.

Referring to both FIGS. 3A and 3C, the example graphical user interface 300 includes a well level history match indicator section 330 having windows 331, 333, 335, 337 that display selected history match indicators shown in Table 2. Window 331 includes a graph 332 configured as a bar illustrating the number of wells in each static bottom hole pressure (SBHP) history match indicator category. In some embodiments, segments of the graph 332 are colored to indicate which history match indicator classification is represented. For example, segment 332A of the graph 332 may be colored dark green which shows the number of wells having a SBHP history match indicator of 0 (i.e., "Excellent"), segment 332B of the graph 332 may be colored light green which shows the number of wells having a SBHP history match indicator of 1 (i.e., "Good"), and segment 332C may be colored yellow which shows the number of wells having a SBHP history match indicator of 2 (i.e., "Acceptable"). It should be understood that other colors or indicia may be utilized. Similarly, window 333 includes a graph 334 configured as a bar illustrating the number of wells in each water production rate (WPR) history match indicator category, window 335 includes a graph 336 configured as a bar illustrating the number of wells in each gas production rate (GPR) history match indicator classification, and window 337 includes a graph 338 configured as a bar illustrating the number of wells in each subsurface history match classification. In some embodiments, the user may select which history match indicators are displayed in the well level history match indicator section 330.

At block 112 of the flowchart of FIG. 1, combined history match indicators are also calculated and then displayed in the combined history match indicator section 320 of the graphical user interface 300 of FIG. 3A (also shown in FIG. 3B). Thus, in addition to calculating and displaying the individual history match indicators by themselves, they can be combined to show the quality of surface, subsurface and overall history match. Table 3 below illustrates sample combined history match indicators and how they are calculated.

TABLE 3

| Attribute | KPI Calculation | Formula Description |
|---|---|---|
| Surface Field Level History Match KPI | (FOP KPI)$x_1$ + (FWP KPI)$x_2$ | Weighted average of all the field surface attributes. Weights defined by $x_n$ are user defined and $\sum_{1}^{n} x_n = 1$ |
| Surface Well Level History Match KPI | (SBHP KPI)$x_1$ + (WWP KPI)$x_2$ + (WGP KPI)$X_3$ | Weighted average of all the well level surface attributes. Weights defined by $x_n$ are user defined and $\sum_{1}^{n} x_n = 1$ |
| Subsurface Level History Match KPI | (SW KPI)$x_1$ + (K KPI)$x_2$ + (LC KPI)$x_3$ | Weighted average of all the subsurface attributes. Weights defined by $x_n$ are user defined and $\sum_{1}^{n} x_n = 1$ |
| Overall History Match KPI | (FOP KPI)$x_1$ + (FWP KPI)$x_2$ + (SBHP KPI)$x_3$ + (WWP KPI)$x_4$ + (WGP KPI)$x_5$ + (SW KPI)$x_6$ + (K KPI)$x_7$ + (LC KPI)$x_8$ | Weighted average of all the surface and sub-surface attributes. Weights defined by $x_n$ are user defined and $\sum_{1}^{n} x_n = 1$ |

As shown by Table 3, the surface field level history match indicator takes the weighted average of all field surface attributes, the surface well level history match indicator takes the weighted average of all well level history match indicators, the subsurface level history match indicator takes the weighted average of all subsurface level history match indicators, and the overall history match indicator takes the weighted average of all history match indicators. The weights may be defined by the user in some embodiments.

Windows 321, 323, 325, and 327 display the values for the overall history match indicator, the surface field level history match indicator, the surface well level history match indicator, and the subsurface level history match indicator, respectively. In some embodiments, the windows 321, 323, 325, and 327 may include a colored icon to represent the indictor value (e.g., dark green, light green, yellow, orange, and red).

Additionally, in some embodiments, various plots are calculated and displayed in the graphical user interface 300. Referring to FIGS. 3A and 3C, window 341 displays an overall field oil production profile plot 342 over a date range, and window 343 displays an overall water production profile plot 344 over a date range. Both plots 342 and 344 plot both the simulated values and the actual value so that a user may see the differences between the simulated values and the actual values.

Referring now to FIGS. 1, 3A and 3C, at block 114 of the flowchart 100 a user may make selections to further drill down and review additional information regarding the history matching between the simulation model and actual data that is displayed in block 116. For example, a user may select a segment of one or more graphs displayed in windows 331, 333, 335 or 337. In the illustrated embodiment, selection of the one or more graphs causes the well locations of the wells associated with the selected one or more graphs to be displayed in a map in window 360. Thus, a user may see where the wells having a history match indicator of interest are located. As a non-limiting example, a user may select a segment corresponding to a poor and/or very poor history match indicator, which would cause the locations of these wells to be displayed in window 360. If many of the wells having a poor or very poor history match indicator are close together it may indicate that the model needs to be adjusted at those locations in some manner.

To further drill down to the well level, a user may select individual wells in window 360 to display various profiles in windows 345, 347, 349, and 351. Any profiles may be plotted. In the illustrated example, well static bottom hole pressure by date is plotted in window 345 by plot 346 that includes both simulated and actual values. Well WPR by date is plotted in window 347 by plot 348 that includes both simulated and actual values. Well GPR by date is plotted in window 349 by plot 350 that includes both simulated and actual values. The well subsurface saturation profile used to calculate the SW metric is plotted in window 351 by plot 352 that includes both simulated and actual values (the y-axis is the water saturation values and the x-axis is the measured depth in feet of saturation log).

Thus, the graphical user interface 300 illustrated by FIGS. 3A-3C enables a user to see how well a selected model performs based on history matching. The user can see high level, combined history match indicators, specific, individual history match indicators for specific attributes, profiles for selected wells, and locations of wells that meet a selected history match indicator. Further, unlike existing systems and methods, embodiments of the present disclosure allow for the use of subsurface metrics and subsurface history match indicators to evaluate simulation model performance.

Although production history match indicators do provide an indication of how well the simulation model matches historical data, it does not tell the whole story. Typically, changes to a simulation model are made to better match the simulation model to reality. A simulation model having few changes for history matching purposes may perform better at prediction than a simulation model that required many changes for history matching purposes. Additionally, some engineers may make localized changes, such as changing the permeability around a well, to obtain better history matching. Such changes are unrealistic and may produce artifacts that affect the ability for the simulation model to make accurate predictions. Changes should be geologically consistent and accurate.

Figure 4A:
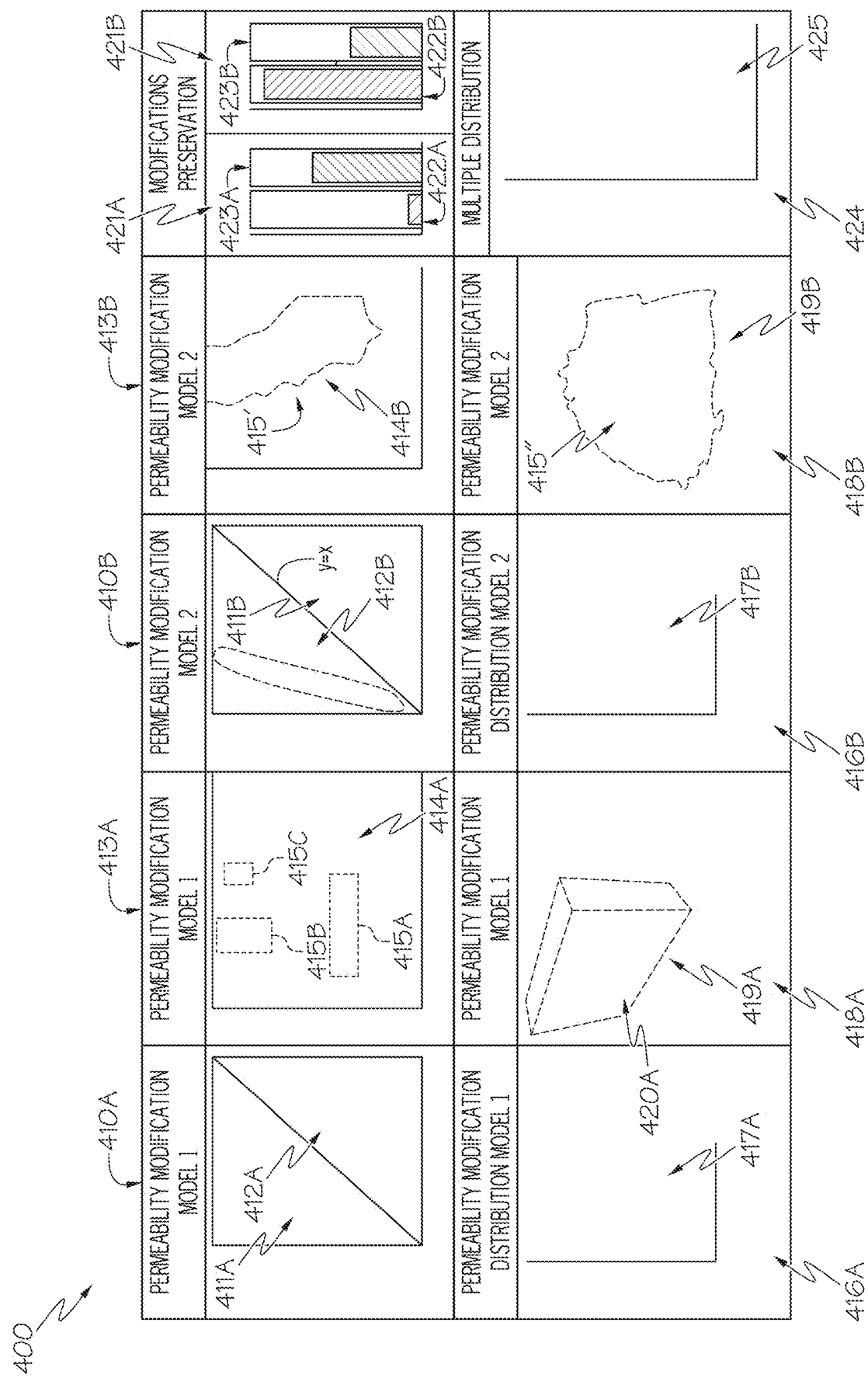
FIG. 4A illustrates an example graphical user interface for comparing changes to two simulation models according to one or more embodiments described and illustrated herein.
Figure 4B:
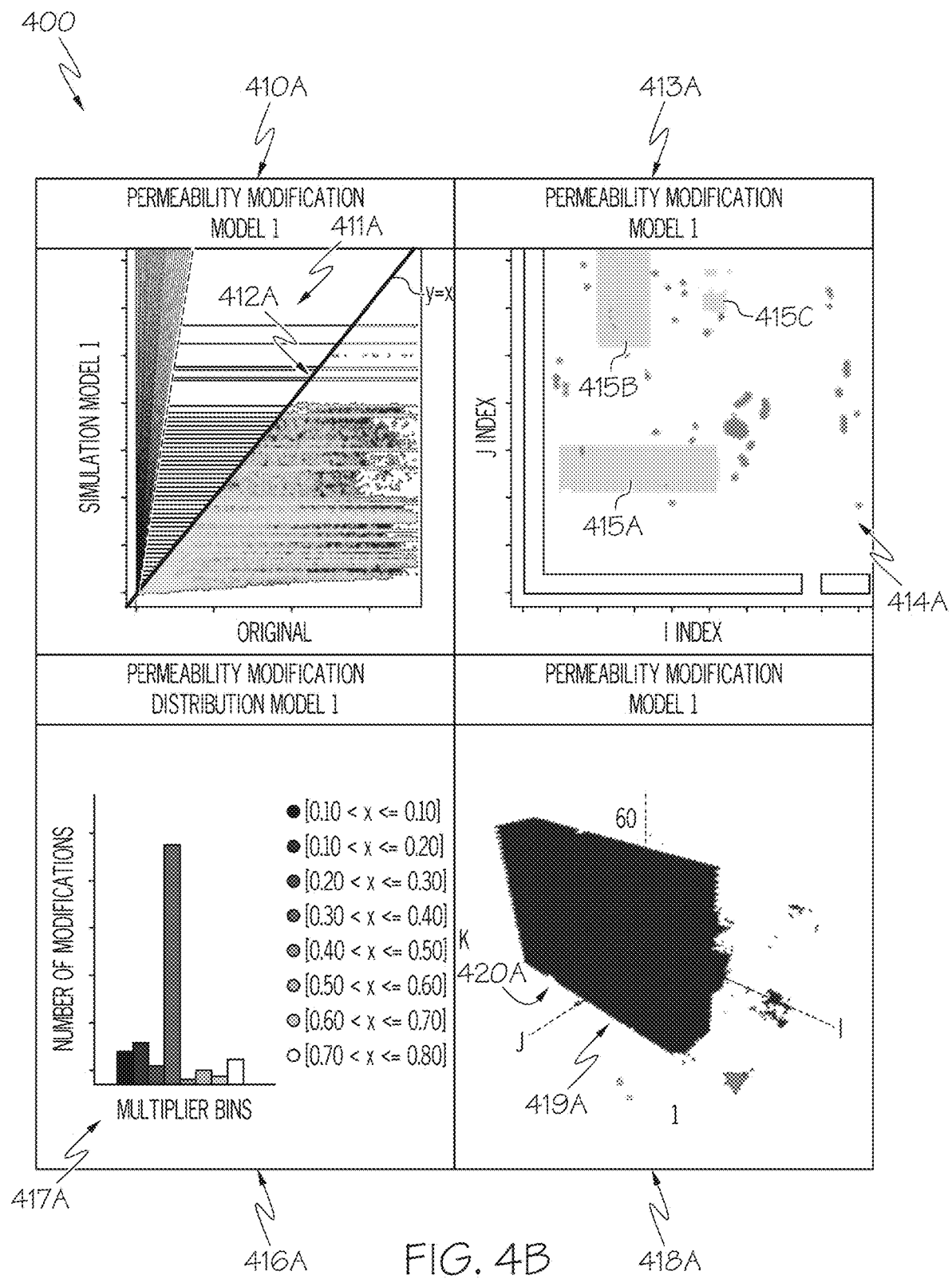
FIG. 4B illustrates a close-up view of the graphical user interface illustrated by FIG. 4A.
Figure 4C:
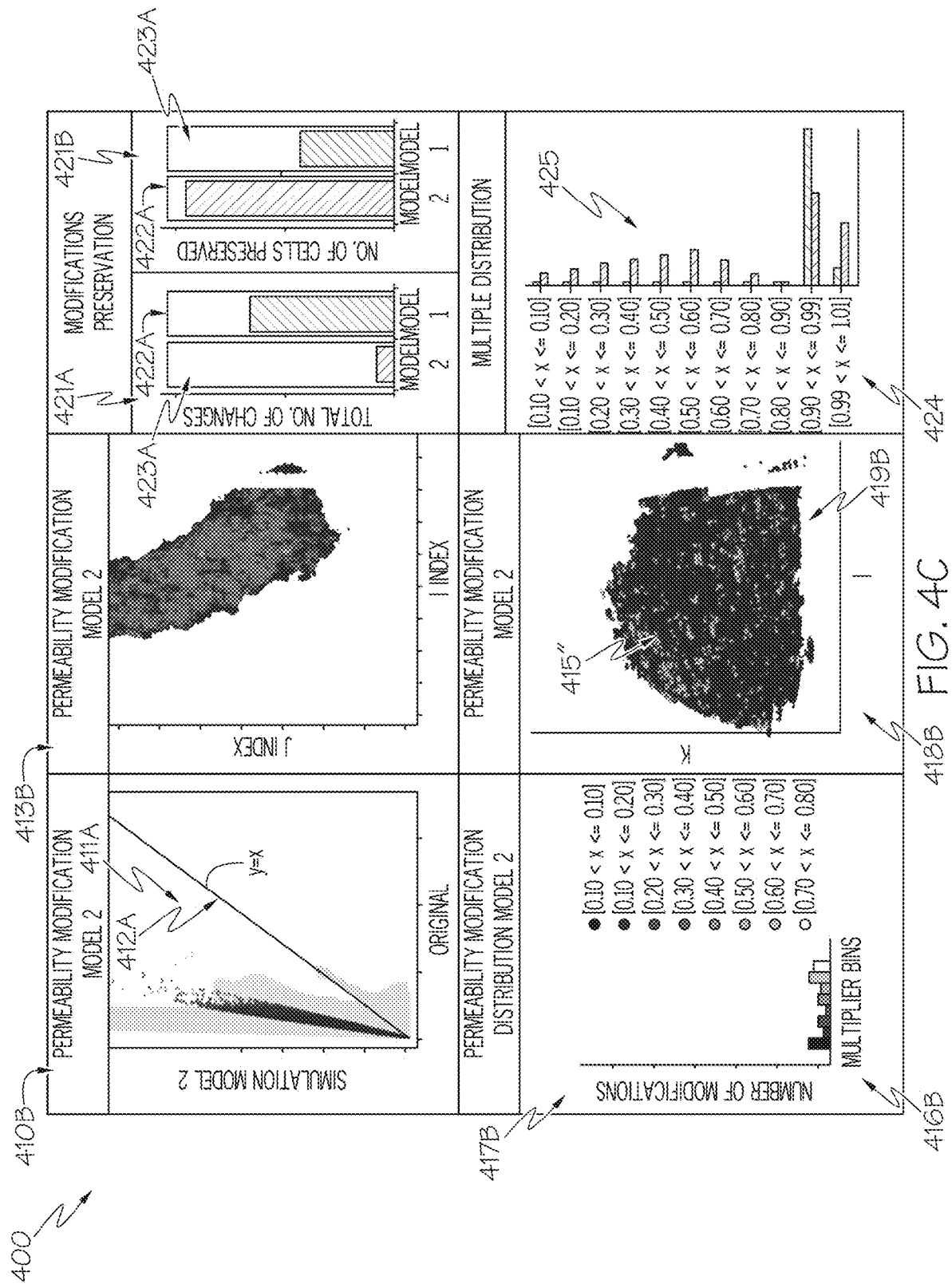
FIG. 4C illustrates a close-up view of the graphical user interface illustrated by FIG. 4A.

Embodiments of the present disclosure may also include a graphical user interface that illustrates the number of overall changes and the number of local changes made to a simulation model. An example graphical user interface 400 for comparing changes to multiple simulation models is illustrated by FIG. 4A. Close-up views of the graphical user interface 400 are shown in FIGS. 4B and 4C. The example graphical user interface 400 compares two simulation models, Model 1 and Model 2. Window 410A provides a plot 411A that plots permeability values of the original simulation model (x-axis) and the changed permeability value (y-axis). In some cases, a user may provide a multiplier to permeability values at some defined area of the three-dimensional model (e.g., around a well). Window 410A is a very useful visual that can help in determining in an instant the extent of local changes that were made. In this plot, there may be tens of millions of changes corresponding to three-dimensional model cells. Thus, this is a very large amount of spatial information which may be difficult for a user to take in and visualize. However, plotting as shown in window 410A, immediately highlights subjective changes made in the three dimensional model to a user.

Subjective changes may come in different forms. For example, a user may multiply all permeability values in a certain region by 10. When such a multiplier is made, it causes horizontal bands 412A to appear in the plot 411A. The horizontal bands are formed when a user modifies the original permeability by assigning a single constant value across an entire region. For example, the original permeability in a certain region could be values between 1 md to 1000 md, but if this distribution is replaced with a constant value such as 100 md for an entire region it would result in horizontal lines within the plot, thus completely distorting the underlying model geology. Horizontal lines are an extreme case of modification. If a region is modified by multiplying original permeability with any constant multiplier value instead of assigning constant value, it will also result in straight line bands with all points having a change to original permeability value ratio equal to the value of the constant multiplier value that is used. Points not modified at all will fall perfectly on the y=x line since their original and changed permeability is the same. Points with a constant multiplier value >1 will have straight line bands above y=x line, and points with constant multiplier value <1 will have straight line bands below y=x line. Any bands of lines indicates subjectivity of history matching. Ideally, the history match should have a majority of the points along y=x line and the ones which are changed should not be changed in the way which leads to these bands.

Window 413A includes a plot 414A wherein the x-axis is the I Index and the y-axis is the J Index. I, J and K indexes are the three-dimensional indexes used to define the three-dimensional model in Cartesian space. I represents UTMX or X direction, J represents UTMY or Y direction, and K represents depth or z direction. Thus, 413A shows the top view of the model in space, with all the K layers stacked on top of each other. Since from window 416A a particular constant multiplier value bin value is selected, it is showing all the cells where such changes were made in window 413A. As described above, it is expected that the artifacts of subjectivity result from such constant multiplier changes and this is what is visible in the three-dimensional model representation shown in 413A). When local changes are made, such as by a multiplier as described above, defined artifacts will appear within the plot 414A, such as artifacts 415A, 415B, and 415C. Window 418A shows the plot 414A of window 413A but in a three-dimensional plot 419A wherein K is the z-axis. The artifact 420A appears as a pillar in the plot.

Window 416A provides a graph 417A that plots the number of modifications in bins of multiplier ranges. In other words, window 416A provides a histogram of the number of changes made within each bin, so whereas window 410A visually identifies the local changes, window 416A is used to actually quantifying these changes. The x-axis is the multiplier bins (e.g., 0.01<x<0.10) and the y-axis is the number of modifications. The X-axis here is the multiplier values binned into interval. These multipliers are calculated by dividing the modified permeability by the original permeability. The Y-axis is the number of times cells were modified using the values within each binned interval. Binned values around 1 indicate little to no changes in the model permeability, values greater than 1 indicate an increase in permeability, and vice versa. Thus, with this plot, the magnitude of changes made, the direction in which changes are made, and what multipliers are used are able to be quantified. Window 416A may be used to then drill down to visualize the changes in the top view shown in window 413A and the three-dimensional view shown in window 418A. For example, in window 416A the multiplier bin values towards the extreme left are selected. These are the cells where the permeability has been decreased, i.e. the multiplier value is way less than 1. Because a significant number of changes are made, in these bins it is expected to see local changes and artifacts, which is what is shown in windows 413A and 418A. In summary, windows 410A, 413A and 418A are utilized to visually quantify the changes, whereas window 416A is used to quantify these changes statistically.

Results of Model 2 are shown in windows 410B, 413B, 416B, and 418B that correspond to windows 410A, 413A, 416A, and 418A regarding Model 1. The plot 411B of window 410B does not include the horizontal lines shown in window 410A. Highlighted points 412B show that the changes are not made by local multipliers because they do not form the horizontal lines. Plot 414B in window 413B includes a structure 415' that is not well defined and does not have straight lines/edges. Three-dimensional plot 419B further shows that the structure 415" is not well defined. Structure 415' and structure 415" illustrate that the permeability changes were physics-based, and not manually and subjectively made by a user.

Window 421A compares the number of multipliers applied to each model. Bar 422A corresponds to the number of individual multipliers applied to original Model 2 and bar 423A corresponds to the number of individual multipliers applied to original Model 1. As shown in window 421A, many more multipliers were applied to Model 1 as compared to Model 2. Window 421B illustrates the number of cells in each model that were preserved. "Modification" characterizes how many cells in the three-dimensional model were changed to achieve the history match, while "Preservation" characterizes how many cells in three-dimensional model are still preserved to the original values. Together, the sum of modification and preservation for each model should equal to the total number of 3D cells in the model.

Window 424 compares Model 1 and Model 2 with respect to the distribution of permeability changes that were made across multiple bins. Window 424 illustrates that Model 1 had changes across many more bins than Model 2, and that the permeability changes in Model 2 were primarily in the bin corresponding to a multiplier between 0.99 and 1.01 (and including 1.01). Thus, the permeability changes were more consistently applied in Model 2.

Accordingly, using the graphical user interface 400 of FIGS. 4A-4C, a user may determine, at a glance, that Model 2 is preferred over Model 1 because fewer changes were made and because the changes were not locally made.

Figure 5:
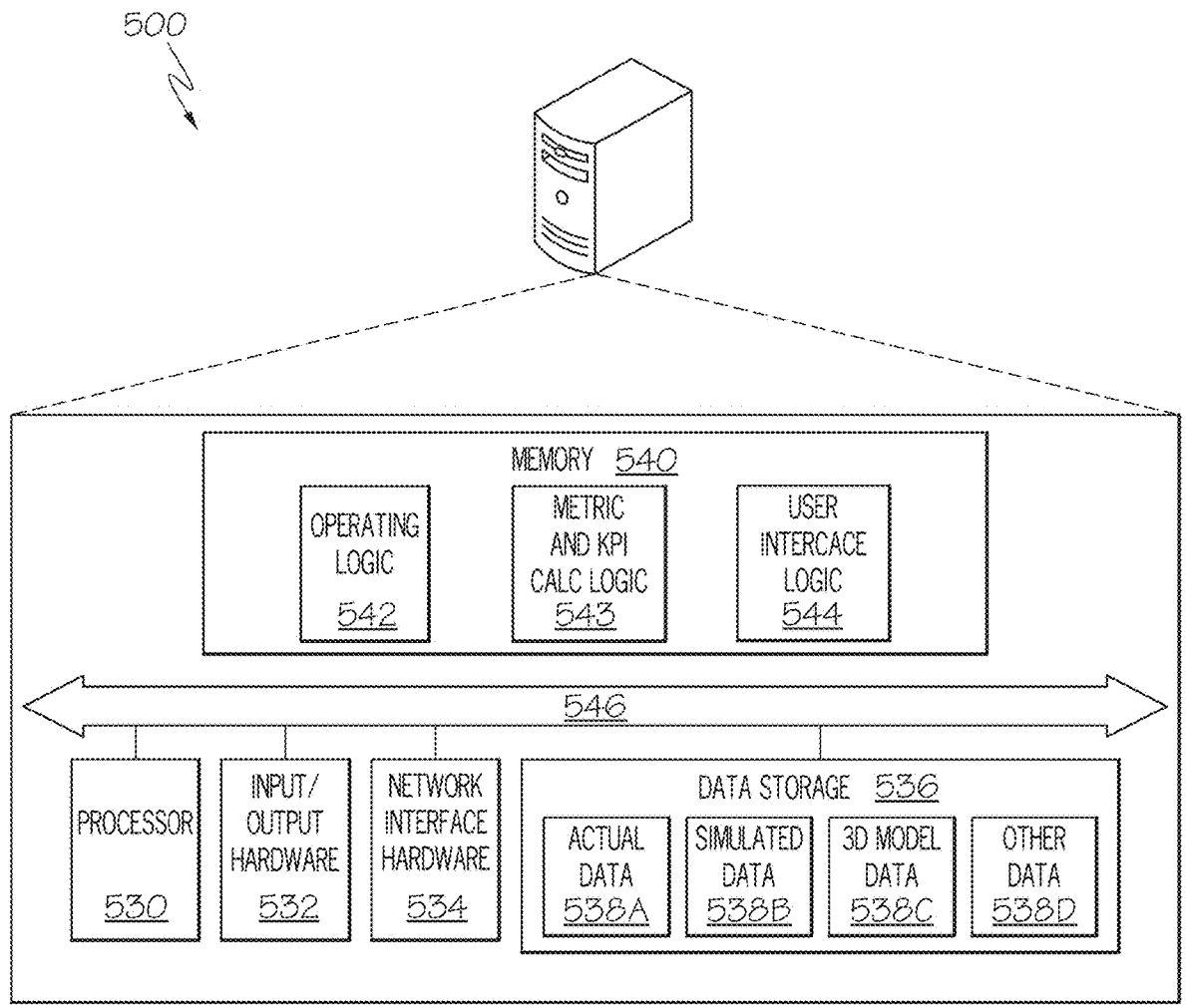
FIG. 5 illustrates an example computing system for performing the evaluation of a simulation model of a hydrocarbon field.

Embodiments of the present disclosure may be implemented by a computing device, and may be embodied as computer-readable instructions stored on a non-transitory memory device. FIG. 5 depicts an example computing device 500 configured to perform the functionalities described herein. The example computing device 500 provides a system for evaluating a simulation model of a hydrocarbon field, and/or a non-transitory computer usable medium having computer readable program code for evaluating a simulation model of a hydrocarbon field embodied as hardware, software, and/or firmware, according to embodiments shown and described herein. While in some embodiments, the computing device 500 may be configured as a general purpose computer with the requisite hardware, software, and/or firmware, in some embodiments, the computing device 500 may be configured as a special purpose computer designed specifically for performing the functionality described herein. It should be understood that the software, hardware, and/or firmware components depicted in FIG. 5 may also be provided in other computing devices external to the computing device 500 (e.g., data storage devices, remote server computing devices, and the like).

As also illustrated in FIG. 5, the computing device 500 (or other additional computing devices) may include a processor 530, input/output hardware 532, network interface hardware 534, a data storage component 536 (which may store actual reservoir data 538A, simulated reservoir data 538B, three-dimensional model data 538C, and any other data 538D), and a non-transitory memory component 540. The memory component 540 may be configured as volatile and/or non-volatile computer readable medium and, as such, may include random access memory (including SRAM, DRAM, and/or other types of random access memory), flash memory, registers, compact discs (CD), digital versatile discs (DVD), and/or other types of storage components. Additionally, the memory component 540 may be configured to store operating logic 542, metric and history match indicator calculation logic 543, and graphical user interface logic 544 (each of which may be embodied as computer readable program code, firmware, or hardware, as an example). A local interface 546 is also included in FIG. 5 and may be implemented as a bus or other interface to facilitate communication among the components of the computing device 500.

The processor 530 may include any processing component configured to receive and execute computer readable code instructions (such as from the data storage component 536 and/or memory component 540). The input/output hardware 532 may include an electronic display device, keyboard, mouse, printer, camera, microphone, speaker, touchscreen, and/or other device for receiving, sending, and/or presenting data. The network interface hardware 534 may include any wired or wireless networking hardware, such as a modem, LAN port, wireless fidelity (Wi-Fi) card, WiMax card, mobile communications hardware, and/or other hardware for communicating with other networks and/or devices, such as to receive the actual reservoir data 538A, the simulated reservoir data 538B, and the three-dimensional model data 538C from various sources, for example.

It should be understood that the data storage component 536 may reside local to and/or remote from the computing device 500, and may be configured to store one or more pieces of data for access by the computing device 500 and/or other components. As illustrated in FIG. 5, the data storage component 536 may include actual reservoir data 538A, which in at least one embodiment includes historical reservoir data from actual wells. Similarly, simulated reservoir data 538B may be stored by the data storage component 536 and may include data as output from one or more simulation models that model attributes of wells of a hydrocarbon field. Three-dimensional model data 538C may also be stored by the data storage component 536 and may include data that represents the three-dimensional geological space of one or more hydrocarbon fields. Other data 538D to perform the functionalities described herein may also be stored in the data storage component 536.

Included in the memory component 540 may be the operating logic 542, the metric and history match indicator calculation logic 543, and the graphical user interface logic 544. The operating logic 542 may include an operating system and/or other software for managing components of the computing device 500. Similarly, the metric and history match indicator calculation logic 543 may reside in the memory component 540 and may be configured to produce the various metrics and history match indicators that are displayed. The graphical user interface logic 544 may be configured to generate the graphical user interfaces described herein and to plot the various properties described herein to enable a user to evaluate simulation models at a glance.

It should now be understood that embodiments of the present disclosure are directed to systems and methods for evaluating a simulation model of a hydrocarbon field. Embodiments calculate metrics used for history matching that compare simulated reservoir data with actual reservoir data. From the metrics, history match indicators based on user-defined criterion are calculated and displayed. Both surface and subsurface history match indicators are calculated and displayed. Further, the history match indicators include a permeability change history match indicator and a local change indicator that provides insight as to how changes were made to the original simulation model. Users may drill-down within a graphical user interface to map individual wells, and plot attribute profiles of individual wells. A graphical user interface may also be used to compare multiple simulation models with respect to how they were modified from the original models.

Having described the subject matter of the present disclosure in detail and by reference to specific embodiments thereof, it is noted that the various details disclosed herein should not be taken to imply that these details relate to elements that are essential components of the various embodiments described herein, even in cases where a particular element is illustrated in each of the drawings that accompany the present description. Further, it will be apparent that modifications and variations are possible without departing from the scope of the present disclosure, including, but not limited to, embodiments defined in the appended claims. More specifically, although some aspects of the present disclosure are identified herein as preferred or particularly advantageous, it is contemplated that the present disclosure is not necessarily limited to these aspects.

What is claimed is:

1. A method of evaluating a simulation model of a hydrocarbon field, the method comprising:

displaying, in a graphical user interface, one or more representations of one or more hydrocarbon fields configured as a bar graph having one or more segments that correspond with the one or more hydrocarbon fields;

upon receiving a selection of an individual segment of the one or more segments corresponding to an individual field of the one or more hydrocarbon fields:

retrieving, from one or more databases, simulated reservoir data and actual reservoir data for the individual hydrocarbon field;

retrieving, from the one or more databases, three-dimensional model data of at least one selected simulation model of the individual hydrocarbon field;

merging the simulated reservoir data and the actual reservoir data to generate merged reservoir data;

cross-linking the merged reservoir data with the three-dimensional model data;

calculating one or more surface metrics from at least one of the merged reservoir data and the three-dimensional model data;

calculating one or more subsurface metrics from at least one of the merged reservoir data and the three-dimensional model data;

calculating one or more overall history match indicators, one or more surface history match indicators, and one or more subsurface history match indicators from the one or more surface metrics, the one or more subsurface metrics, and the three-dimensional model data; and displaying, in a graphical user interface on an electronic display, the one or more overall history match indicators, the one or more surface history match indicators, and the one or more subsurface history match indicators;

receiving, from the graphical user interface, one or more indicator criteria defining ranges for values of the one or more overall history match indicators, the one or more surface history match indicators, and the one or more subsurface history match indicators;

displaying the one or more surface history match indicators and the one or more subsurface history match indicators in a plurality of graphs of the graphical user interface, wherein each graph is a bar comprising a plurality of segments and each segment represents a history match classification based on the one or more indicator criteria;

receiving a selection of an individual segment of the plurality of segments of an individual graph of the plurality of graphs; and displaying, in the graphical user interface, a map of well locations of a plurality of wells represented by the individual segment.

2. The method of claim 1, wherein the one or more subsurface metrics comprises a local change metric and the one or more subsurface history match indicators comprises a local change history match indicator.

3. The method of claim 1, wherein:

the simulated reservoir data comprises simulated production data and simulated well log data, and the actual reservoir data comprises actual production data and actual well log data; and the merging of the simulated reservoir data and the actual reservoir data comprises merging the simulated production data and the actual production data, and merging the simulated well log data and the actual well log data.

4. The method of claim 1, wherein the one or more surface history match indicators comprises a surface field level history match indicator and a surface well level history match indicator.

5. The method of claim 1, wherein:

the simulated reservoir data comprises simulated production data and simulated well log data, and the actual reservoir data comprises actual production data and actual well log data;

the method further comprises displaying, in the graphical user interface, for the plurality of wells represented by the individual segment, one or more plots of one or more of the simulated production data, the simulated well log data, the actual production data, and the actual well log data over time.

6. The method of claim 1, wherein the one or more subsurface metrics comprises a permeability modification metric, and the method further comprises displaying at least one permeability modification metric graph illustrating changes to permeability values of the at least one selected simulation model.

7. The method of claim 6, wherein the at least one selected simulation model comprises a second selected simulation model, and the method further comprises displaying at least one second permeability modification metric graph illustrating changes to permeability values of the second selected simulation model.

8. A system for evaluating a simulation model of a hydrocarbon field comprising:

one or more processors;

an electronic display;

a non-transitory computer-readable memory storing instructions that, when executed by the one or more processors, cause the one or more processors to:

display, in a graphical user interface, one or more representations of one or more hydrocarbon fields configured as a bar graph having one or more segments that correspond with the one or more hydrocarbon fields;

upon receiving a selection an individual segment of the one or more segments corresponding to an individual hydrocarbon field of the one or more hydrocarbon fields:

retrieve, from one or more databases, simulated reservoir data and actual reservoir data for the individual hydrocarbon field;

retrieve, from the one or more databases, three-dimensional model data of at least one selected simulation model of the individual hydrocarbon field;

merge the simulated reservoir data and the actual reservoir data to generate merged reservoir data;

cross-link the merged reservoir data with the three-dimensional model data;

calculate one or more surface metrics from at least one of the merged reservoir data and the three-dimensional model data;

calculate one or more subsurface metrics from at least one of the merged reservoir data and the three-dimensional model data;

calculate one or more overall history match indicators, one or more surface history match indicators, and one or more subsurface history match indicators from the one or more surface metrics, the one or more subsurface metrics, and the three-dimensional model data; and display, in a graphical user interface on the electronic display, the one or more overall history match indicators, the one or more surface history match indicators, and the one or more subsurface history match indicators;

receive, from the graphical user interface, one or more indicator criteria defining ranges for values of the one or more overall history match indicators, the one or more surface history match indicators, and the one or more subsurface history match indicators;

display the one or more surface metrics and the one or more subsurface metrics in a plurality of graphs, wherein each graph is a bar comprising a plurality of segments and each segment represents a history match classification based on the one or more indicator criteria;

receive a selection of an individual segment of the plurality of segments of an individual graph of the plurality of graphs; and display, in the graphical user interface, a map of well locations of a plurality of wells represented by the individual segment.

9. The system of claim 8, wherein the one or more subsurface metrics comprises a local change metric and the one or more subsurface history match indicators comprises a local change history match indicator.

10. The system of claim 9, wherein:
the simulated reservoir data comprises simulated production data and simulated well log data, and the actual reservoir data comprises actual production data and actual well log data; and the merging of the simulated reservoir data and the actual reservoir data comprises merging the simulated production data and the actual production data, and merging the simulated well log data and the actual well log data.

11. The system of claim 8, wherein the one or more surface history match indicators comprises a surface field level history match indicator and a surface well level history match indicator.

12. The system of claim 8, wherein:
the simulated reservoir data comprises simulated production data and simulated well log data, and the actual reservoir data comprises actual production data and actual well log data; and the instructions further cause the one or more processors to display, in the graphical user interface, for the plurality of wells represented by the individual segment, one or more plots of one or more of the simulated production data, the simulated well log data, the actual production data, and the actual well log data over time.

13. The system of claim 8, wherein the one or more subsurface metrics comprises a permeability modification metric, and the method further comprises displaying at least one permeability modification metric graph illustrating changes to permeability values of the at least one selected simulation model.

14. The system of claim 8, wherein the at least one selected simulation model comprises a second selected simulation model, and the method further comprises displaying at least one second permeability modification metric graph illustrating changes to permeability values of the second selected simulation model.

* * * * *